(12) United States Patent
Fukumoto

(10) Patent No.: US 8,288,178 B2
(45) Date of Patent: Oct. 16, 2012

(54) LEAD FRAME, METHOD OF MANUFACTURING THE SAME, AND METHOD OF MANUFACTURING SEMICONDUCTOR DEVICE

(75) Inventor: Yoshinari Fukumoto, Kumamoto (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/461,298

(22) Filed: Aug. 6, 2009

(65) Prior Publication Data

US 2010/0035368 A1  Feb. 11, 2010

(30) Foreign Application Priority Data

Aug. 11, 2008  (JP) .................................. 2008-207447

(51) Int. Cl.
H01L 21/66  (2006.01)

(52) U.S. Cl. .................. 438/18; 257/736; 257/E23.031; 257/E21.53; 427/436; 361/813

(58) Field of Classification Search ........... 257/E21.527, 257/E21.523, E21.524, E21.51, E21.522, 257/736, E21.53, E23.031, E23.014; 438/18, 438/15; 361/813; 427/436; 374/101
See application file for complete search history.

(56) References Cited

U.S. PATENT DOCUMENTS

| | | | | |
|---|---|---|---|---|
| 3,243,303 A * | 3/1966 | Johnson | ........................... | 426/88 |
| 5,210,441 A * | 5/1993 | Nakashima et al. | .......... | 257/677 |
| 5,326,174 A * | 7/1994 | Parker | ........................... | 374/134 |
| 5,360,991 A | 11/1994 | Abys et al. | | |
| 5,475,224 A * | 12/1995 | Koh | .............................. | 250/349 |
| 5,482,000 A * | 1/1996 | Ward | ............................. | 116/217 |
| 5,602,804 A * | 2/1997 | Haas | .............................. | 368/327 |
| 5,630,372 A * | 5/1997 | Ramsey et al. | ............... | 116/206 |
| 5,822,280 A * | 10/1998 | Haas | .............................. | 368/327 |
| 5,913,552 A * | 6/1999 | McLellan et al. | ............... | 29/843 |
| 6,021,046 A * | 2/2000 | McLellan et al. | ............. | 361/719 |
| 6,042,264 A * | 3/2000 | Prusik et al. | .................. | 374/106 |
| 6,435,128 B2 * | 8/2002 | Qiu et al. | ..................... | 116/207 |
| RE38,588 E * | 9/2004 | Tanimoto et al. | ............. | 428/647 |

(Continued)

FOREIGN PATENT DOCUMENTS

JP  55-019846  * 12/1980

(Continued)

OTHER PUBLICATIONS

Translation of JP 2004-128355, Kobayashi (Apr. 2004), 8 pages.*

(Continued)

*Primary Examiner* — Caridad Everhart

(74) *Attorney, Agent, or Firm* — McGinn IP Law Group, PLLC

(57) ABSTRACT

A lead frame is provided that includes a base metal, a plated layer provided on a part of the surface of the base metal, and a thermal history monitor portion that discolors under heat load applied thereto, provided at another part of the base metal surface. A method of manufacturing a semiconductor device includes an assembly process including mounting a semiconductor chip on the lead frame, performing a wire bonding process thereby connecting the semiconductor chip and the lead frame, and encapsulating with a resin the wire-bonded semiconductor chip and the lead frame, and then performing an appearance check after the assembly process to inspect whether the thermal history monitor portion has discolored under heat load applied through the assembly process, thereby deciding whether an abnormality has emerged through the thermal history.

28 Claims, 6 Drawing Sheets

U.S. PATENT DOCUMENTS

| | | | |
|---|---|---|---|
| 7,692,277 B2 * | 4/2010 | Tomohiro et al. | 257/677 |
| 2002/0127847 A1 * | 9/2002 | Alling et al. | 438/630 |
| 2003/0160315 A1 * | 8/2003 | Kovar et al. | 257/685 |
| 2004/0028875 A1 * | 2/2004 | Van Rijn et al. | 428/98 |
| 2006/0079011 A1 * | 4/2006 | Tandy et al. | 438/14 |
| 2009/0159866 A1 * | 6/2009 | Shah et al. | 257/2 |
| 2010/0044858 A1 * | 2/2010 | Cohn et al. | 257/734 |

FOREIGN PATENT DOCUMENTS

| | | | |
|---|---|---|---|
| JP | 7-169901 A | | 7/1995 |
| JP | 9-17932 A | | 1/1997 |
| JP | 2004-128355 | * | 4/2004 |

OTHER PUBLICATIONS

Abstract of JP55-019846, Abe (1980), 2 pages.*

* cited by examiner

LEAD FRAME, METHOD OF MANUFACTURING THE SAME, AND METHOD OF MANUFACTURING SEMICONDUCTOR DEVICE This application is based on Japanese patent application No. 2008-207447, the content of which is incorporated hereinto by reference.

BACKGROUND

1. Field of the Invention

The present invention relates to a lead frame to be used for assembling a semiconductor device, a method of manufacturing the lead frame, and a method of manufacturing the semiconductor device.

2. Related Art

Lead frames for semiconductor assembly so far developed include the one disclosed in JP-A No. H07-169901. Paragraph [0009] of this document states that depositing a palladium or soft metal strike layer, a Pd—Ni layer, a Pd layer and an Au layer in an ascending order on a Ni layer enables attaining a composite surface structure that can effectively cover a base metal of the lead frame.

Also, paragraph [0015] of JP-A No. H09-017932 states that the composite surface structure on the lead frame is to include a Pd (soft metal) strike layer, a Pd—Ni alloy layer and a Pd layer in an ascending order on the Ni layer, to thereby finish the lead frame with a reduced amount of precious metal or without using Au, while securing sufficient soldering performance of the lead frame surface.

With the conventional composite plated structure on the lead frame of a pre-plated frame type (hereinafter, PPF), however, the lower layer metals other than that of an outermost surface layer, such as Ni, perform grain boundary diffusion when heat load is applied through an assembly process of a semiconductor, and come up into the outermost surface layer. The Ni, which has thus intruded in the outermost surface layer, constitutes a predominant factor that degrades the bonding performance between an Au wire and the lead frame, as well as the adhesion between the lead frame and an encapsulating resin.

The lead frame for semiconductor provided with the composite surface structure according to Japanese Laid-open patent publication No. A-H07-169901 and Japanese Laid-open patent publication No. A-No. H09-017932 has its entire surface covered with the Pd plated layer and so forth, and therefore it is impossible to decide whether Ni is present in the outermost surface layer by appearance inspection, after undergoing the heat load through the assembly process.

In the actual assembly process, consequently, defects are revealed such that the Au wire cannot be bonded to the lead frame with the composite plating, and that the lead frame with the composite plating is not completely adhered to the encapsulating resin and comes off.

SUMMARY

In one embodiment, there is provided a lead frame comprising a base metal constituting a main portion of the lead frame; a composite plated layer provided over a surface of the base metal; and a thermal history monitor portion that discolors under heat load.

In another embodiment, there is provided a method of manufacturing a lead frame comprising masking with a masking film a part of such a portion of a base metal constituting a main portion of the lead frame that is not to be included in a semiconductor device; performing a plating process over the base metal of the lead frame with a plating solution thereby forming a composite plated layer; and removing the masking film.

In still another embodiment, there is provided a method of manufacturing a semiconductor device comprising assembling the semiconductor device including preparing the foregoing lead frame and mounting a semiconductor chip thereon, performing a wire bonding process thereby connecting the semiconductor chip and the lead frame, and encapsulating with a resin the wire-bonded semiconductor chip and the lead frame; and performing an appearance check after the assembling to inspect whether the thermal history monitor portion has discolored under heat load applied through the assembling, thereby deciding whether an abnormality has emerged through the thermal history.

The lead frame thus constructed includes the thermal history monitor portion that discolors under heat load, while the base metal surface is provided with the composite plated layer, and therefore the thermal history monitor portion discolors in case that abnormal heat load is imposed on the lead frame, to thereby enable deciding whether an abnormality has emerged through the thermal history, by appearance check.

Thus, the present invention provides a lead frame with a composite plated layer that allows deciding whether an abnormality has emerged through the thermal history, by appearance inspection after the semiconductor assembly process.

Therefore, the lead frame with the composite plated layer according to the present invention allows, because of includes the thermal history monitor portion, discovering a defect of the composite plated layer by appearance check in case that the thermal history has imposed an abnormal condition, before actually proceeding to the assembly process, more particularly one stage anterior to the Au wire bonding process, or two stages anterior to the resin encapsulation process.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
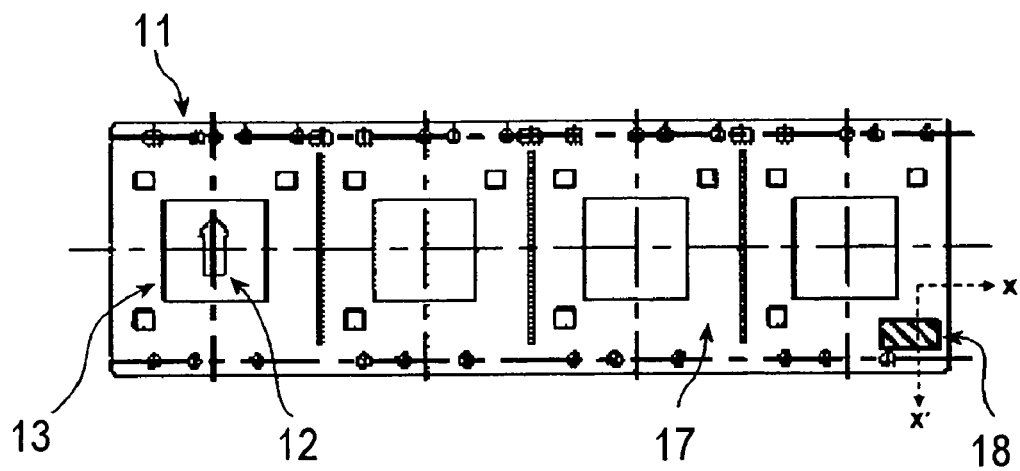
FIG. 1 is a plan view showing a PPF lead frame carrying a thermal history monitor portion with an exposed Cu ground, according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, embodiments of the present invention will be described, referring to the drawings. In all the drawings, same constituents are given the same numeral, and the description thereof will not be repeated.

First Embodiment

Figure 2:
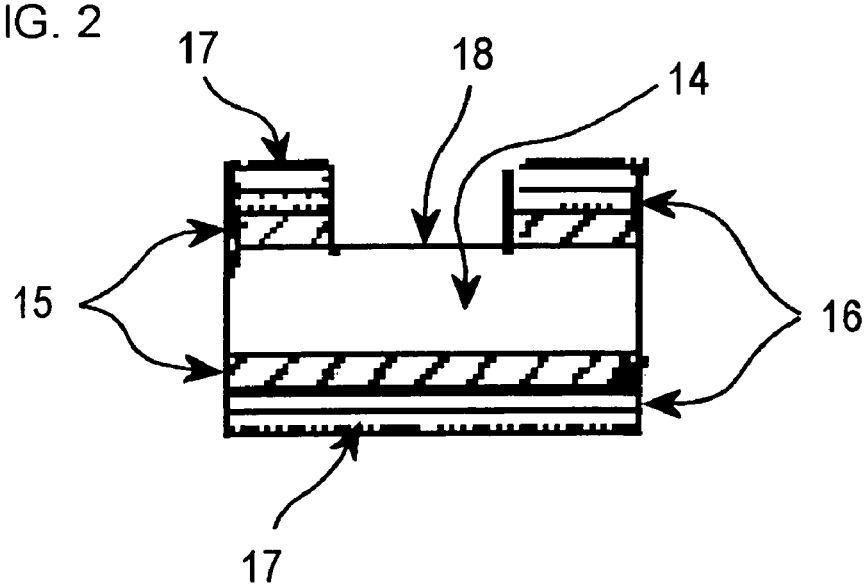
FIG. 2 is a cross-sectional view of the thermal history monitor portion with the exposed Cu ground, according to the first embodiment.

The first embodiment will be described referring to FIGS. 1 and 2. FIG. 2 is a cross-sectional view taken along a line X-X' in FIG. 1. A PPF lead frame 11 according to the first embodiment includes a base metal (Cu or Cu alloy) 14 constituting the main portion of the PPF lead frame 11, a composite plated layer (a Ni plated layer 15, a Pd plated layer 16 and an Au plated layer 17) provided over the base metal (Cu or Cu alloy) 14, and a thermal history monitor portion 18 that discolors under heat load.

Here, the thermal history monitor portion 18, provided at a position where the plated layer is not provided over the surface of the base metal (Cu or Cu alloy) 14, is a location where the Cu or the Cu alloy constituting the base metal 14 is exposed. The thermal history monitor portion 18 barely discolors under the heat load of a normal semiconductor device assembly process, however the Cu or the Cu alloy of the base metal 14 oxidizes under an abnormally high temperature or when stored in a high temperature atmosphere for a long time, and changes its color from black to purple, and eventually to white.

Confirming such change in color enables deciding whether the thermal history applied to the relevant PPF lead frame 11 has been normal or abnormal.

Thus, the thermal history monitor portion 18 alerts through the oxidization of the Cu or the Cu alloy of the base metal 14, upon being subjected to abnormal heat load through the assembly process of the semiconductor device, that a surface of a portion 12 of the PPF lead frame 11 to be included in the semiconductor device has been thereby altered, and that a change that may critically affect the quality of the finished semiconductor device has taken place.

It should be noted that the thermal history monitor portion 18 of the PPF lead frame 11 according to this embodiment in no way affects the quality of the product, because the thermal history monitor portion 18 is provided at a position 13 on the PPF lead frame 11 not to be included in the semiconductor device, and besides removed before the individual semiconductor devices are formed.

A method of manufacturing the lead frame according to the first embodiment will now be described. The method of manufacturing the PPF lead frame 11 includes masking with a masking film 19 a part of the portion 13 not to be included in the semiconductor device, on the base metal (Cu or Cu alloy) 14 constituting the main portion of the PPF lead frame 11; performing a plating process over the base metal (Cu or Cu alloy) 14 of the PPF lead frame 11 with a plating solution thereby forming the composite plated layer (the Ni plated layer 15, the Pd plated layer 16 and the Au plated layer 17); and removing the masking film 19. For the masking film 19, a resist film may be employed.

Figure 3A:
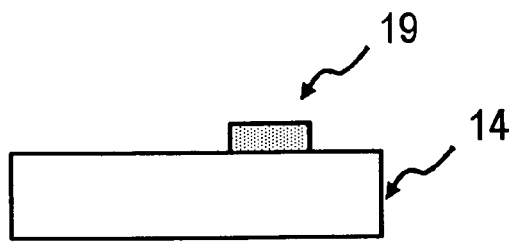
FIGS. 3A to 3C are cross-sectional views for explaining a method of manufacturing the thermal history monitor portion according to the first embodiment.
Figure 3B:
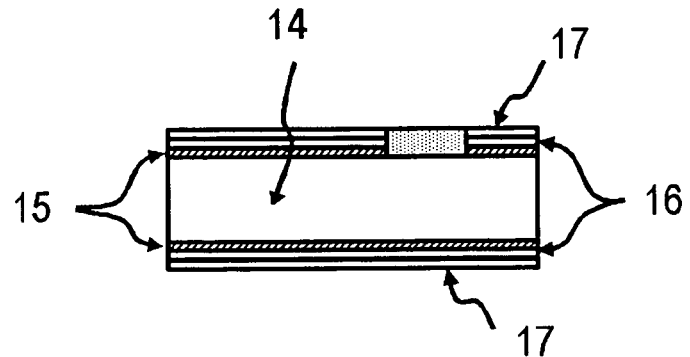
Figure 3C:
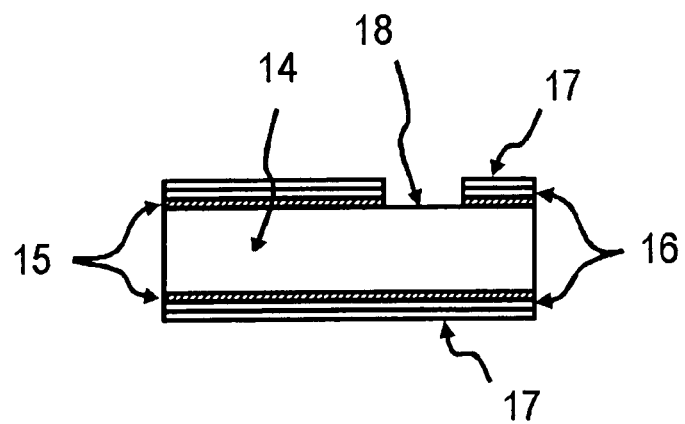

The method of manufacturing the PPF lead frame 11 including the thermal history monitor portion 18, where the Cu ground is exposed, is shown in FIGS. 3A to 3C.

As shown in FIG. 3A, a part of the Cu or the Cu alloy constituting the base metal 14 is masked with the masking film 19. Then as shown in FIG. 3B, the Cu or the Cu alloy of the base metal 14 is sequentially soaked in a Ni plating solution, a Pd plating solution, and an Au plating solution, so as to form the Ni plated layer 15, the Pd plated layer 16 and the Au plated layer 17.

Upon removing the masking film 19 on the Cu or the Cu alloy of the base metal 14 after completing the composite plating process, as shown in FIG. 3C, the PPF lead frame 11 including the thermal history monitor portion 18 can be obtained.

Second Embodiment

The second embodiment is the same as the first embodiment, except that the thermal history monitor portion 18 of the first embodiment is substituted with a thermal history monitor portion 28 constituted of a paint developing color by thermal history.

In the second embodiment, a base metal 24 of a PPF lead frame 21 may be constituted of, for example, a Fe—Ni alloy, instead of the Cu or the Cu alloy. Even in such a case where the base metal is constituted of a material that does not show an apparent change despite undergoing abnormal heat load through the assembly process, applying the paint developing color to the thermal history monitor portion 28 enables explicitly displaying the thermal history applied to the PPF lead frame 21, thereby preventing manufacturing a defective product.

Figure 4:
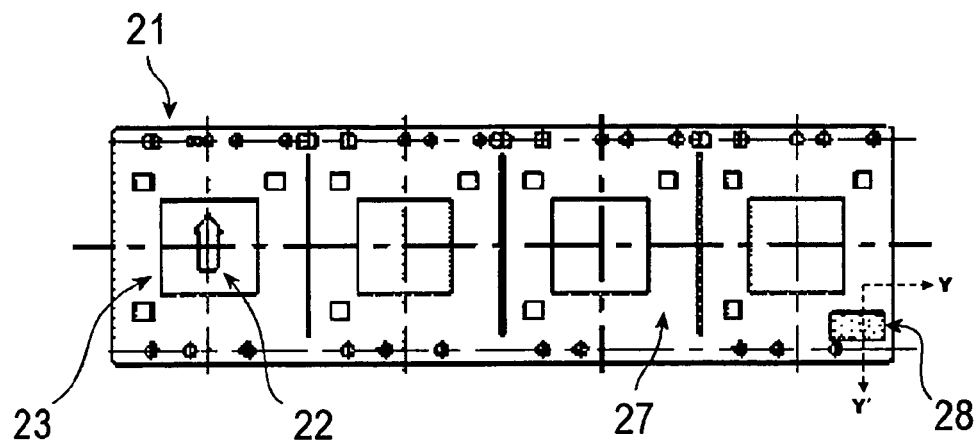
FIG. 4 is a plan view showing a PPF lead frame carrying a thermal history monitor portion coated with a paint developing color by thermal history, according to a second embodiment.
Figure 5:
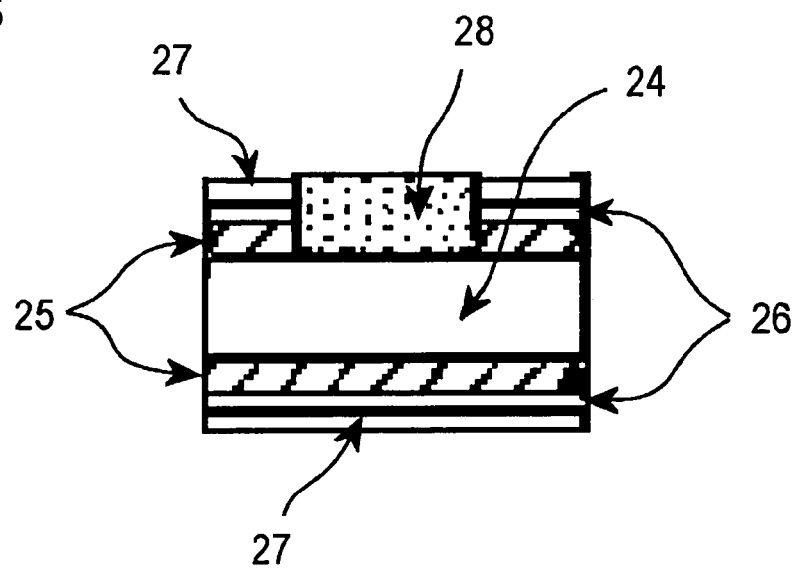
FIG. 5 is a cross-sectional view of the thermal history monitor portion according to the second embodiment.

FIG. 4 is a plan view showing the PPF lead frame 21 according to the second embodiment, and FIG. 5 is a cross-sectional view taken along a line Y-Y' in FIG. 4. The PPF lead frame 21 according to the second embodiment includes a base metal 24 constituting the main portion of the PPF lead frame 21, a composite plated layer (a Ni plated layer 25, a Pd plated layer 26 and an Au plated layer 27) provided over the base metal 24, and a thermal history monitor portion 28 that discolors under heat load. To the thermal history monitor portion 28 located at such a position 23 on the PPF lead frame 21 that is eventually not included in the semiconductor device, an epoxy resin paint containing a pigment that thermally discolors is applied. The epoxy resin paint containing the pigment that thermally discolors displays the thermal history imposed on the PPF lead frame 21 through the assembly process.

Employing further a paint containing a pigment that reacts to several levels of temperature and forming the plan view shape of the thermal history monitor portion 28 in a character or a specific pattern enables attaining a higher level display of the abnormality in the thermal history, still easier to visually recognize than in first embodiment.

Thus, the thermal history monitor portion 28 alerts through the thermally discolors of the epoxy resin paint, upon being subjected to abnormal heat load through the assembly process of the semiconductor device, that a surface of a portion 22 of the PPF lead frame 21 to be included in the semiconductor device has been thereby altered, and that a change that may critically affect the quality of the finished semiconductor device has taken place.

It should be noted that, in this embodiment also, the thermal history monitor portion 28 of the PPF lead frame 21 in no way affects the quality of the product, because the thermal history monitor portion 28 is provided at a position 23 on the PPF lead frame 21 not to be included in the semiconductor device, and besides removed before the individual semiconductor devices are formed.

A method of manufacturing the lead frame according to the second embodiment may be arranged so as to include applying the epoxy resin paint developing color by thermal history to the thermal history monitor portion of the Cu or the Cu alloy according to the first embodiment.

Third Embodiment

A third embodiment will now be described. A feature of the third embodiment is that the thermal history monitor portion 38 is provided on the surface of the Au plated layer 37, and the epoxy resin containing the pigment that thermally discolors under heat load is provided to the thermal history monitor portion 38, as in the second embodiment.

The third embodiment will be described in further details, referring to the drawings.

Figure 6:
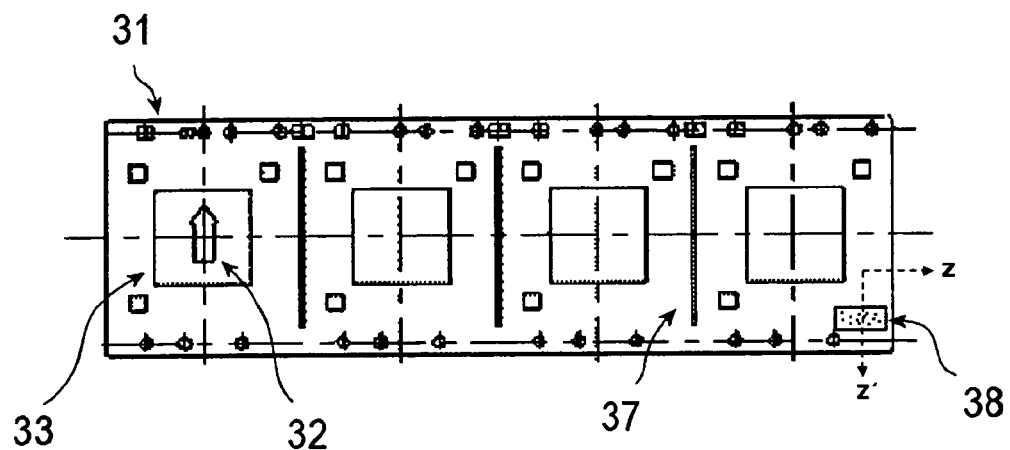
FIG. 6 is a plan view showing a PPF lead frame carrying a thermal history monitor portion coated with the paint developing color by thermal history, according to a third embodiment.
Figure 7:
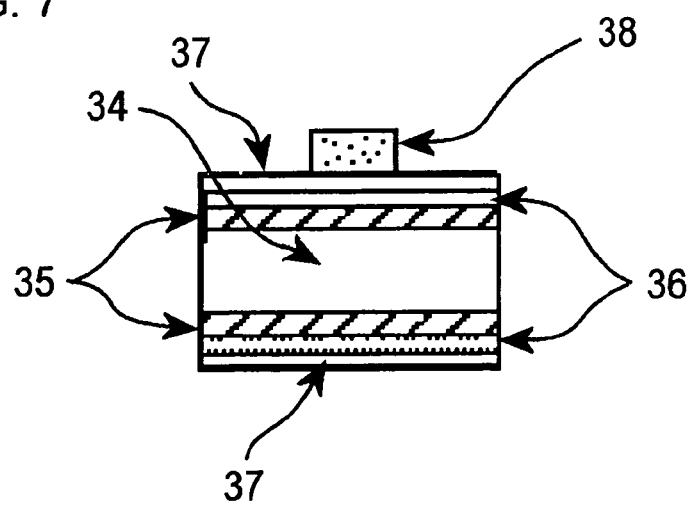
FIG. 7 is a cross-sectional view of the thermal history monitor portion coated with the paint developing color by thermal a history, according to the third embodiment.

FIG. 6 is a plan view showing the PPF lead frame 31 according to the third embodiment, and FIG. 7 is a cross-sectional view taken along a line Z-Z' in FIG. 6. The PPF lead frame 31 according to the third embodiment includes a base metal 34 constituting the main portion of the PPF lead frame 31, a composite plated layer (a Ni plated layer 35, a Pd plated layer 36 and an Au plated layer 37) provided over the base metal 34, and a thermal history monitor portion 38 that discolors under heat load. In the third embodiment also, for example the Fe—Ni alloy may be employed for the base metal 34 of the PPF lead frame 31, instead of the Cu or the Cu alloy.

In this embodiment also, employing a paint containing a pigment that reacts to several levels of temperature and forming a character or a specific pattern enables attaining a higher level display of the abnormality in the thermal history.

Thus, the thermal history monitor portion 38 alerts through the thermally discolors of the epoxy resin paint, upon being subjected to abnormal heat load through the assembly process of the semiconductor device, that a surface of a portion 32 of the PPF lead frame 31 to be included in the semiconductor device has been thereby altered, and that a change that may critically affect the quality of the finished semiconductor device has taken place.

It should be noted that, in this embodiment also, the thermal history monitor portion 38 of the PPF lead frame 31 in no way affects the quality of the product, because the thermal history monitor portion 38 is provided at a position 33 on the PPF lead frame 31 not to be included in the semiconductor device, and besides removed before the individual semiconductor devices are formed.

A method of manufacturing the lead frame according to the third embodiment will be described.

The method of manufacturing the PPF lead frame 31 may be arranged so as to include applying the paint developing color by thermal history to such a position 33 on the surface of the Au plated layer 37 of the PPF lead frame 31 that is eventually not included in the semiconductor device. Such arrangement eliminates the need to form the portion where the plated layer is not provided, unlike in the foregoing embodiments, thereby simplifying the formation process of the thermal history monitor portion 38.

Fourth Embodiment

Figure 8:
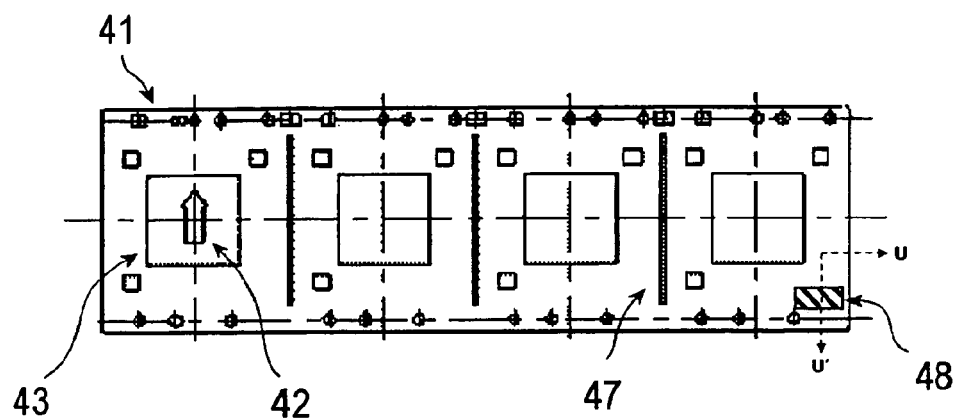
FIG. 8 is a plan view showing a PPF lead frame carrying a thermal history monitor portion with a Cu plated layer, according to a fourth embodiment.
Figure 9:
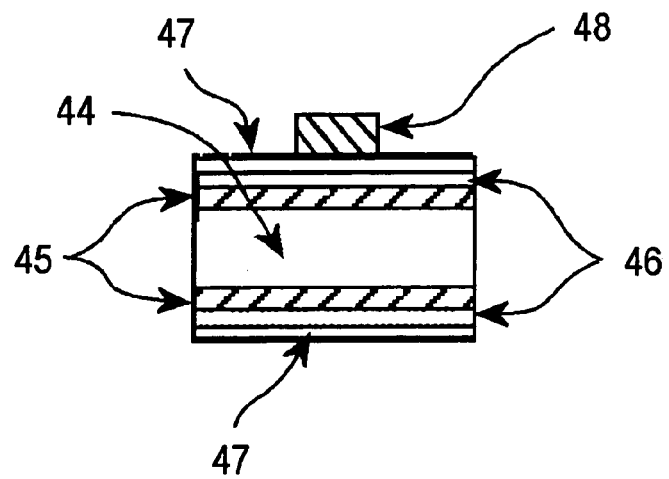
FIG. 9 is a cross-sectional view of the thermal history monitor portion with the Cu plated layer according to the fourth embodiment.

FIG. 8 is a plan view showing the PPF lead frame 41 according to a fourth embodiment, and FIG. 9 is a cross-sectional view taken along a line U-U' in FIG. 8. The PPF lead frame 41 includes a base metal 44 constituting the main portion of the PPF lead frame 41, a composite plated layer (a Ni plated layer 45, a Pd plated layer 46 and an Au plated layer 47) provided over the base metal 44, and a thermal history monitor portion 48 that discolors under heat load. A feature of the fourth embodiment is that a thermal history monitor (Cu plated layer), located on a surface of the Au plating constituting the outermost plated layer of the composite plated layer, at a position 43 not to be included in the semiconductor device, constitutes the thermal history monitor portion 48 that discolors under heat load. Here, the base metal 44 may be either the Cu alloy or other metals such as the Fe—Ni alloy.

The Cu plated layer 50 (FIG. 10) of the thermal history monitor portion 48 barely discolors under the heat load of a normal semiconductor device assembly process, however the Cu plated layer oxidizes under an abnormally high temperature or when stored in a high temperature atmosphere for a long time, and changes its color from black to purple, and eventually to white. Confirming such change in color enables deciding whether the thermal history applied to the relevant PPF lead frame 41 has been normal or abnormal.

Thus, the thermal history monitor portion 48 alerts through the oxidization of the Cu plating, upon being subjected to abnormal stress through the assembly process of the semiconductor device, that a surface of a portion 42 on the PPF lead frame 41 to be included in the semiconductor device has been thereby altered, and that a change that may critically affect the quality of the finished semiconductor device has taken place.

It should also be noted that the thermal history monitor portion 48 of the PPF lead frame 41 according to this embodiment in no way affects the quality of the product, because the thermal history monitor portion 48 is provided at a position 43 on the PPF lead frame 41 not to be included in the semiconductor device, and besides removed before the individual semiconductor devices are formed.

Figure 10A:
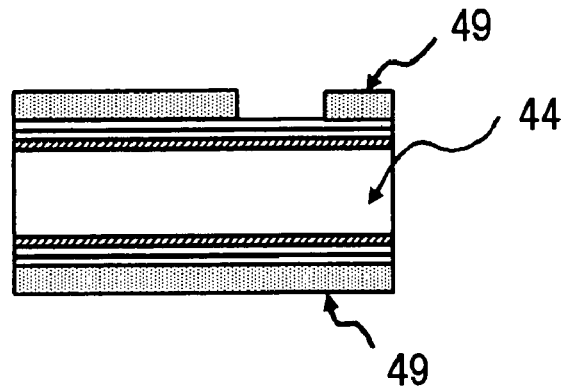
FIGS. 10A to 10C are cross-sectional views for explaining a method of manufacturing the thermal history monitor portion according to the fourth embodiment.
Figure 10B:
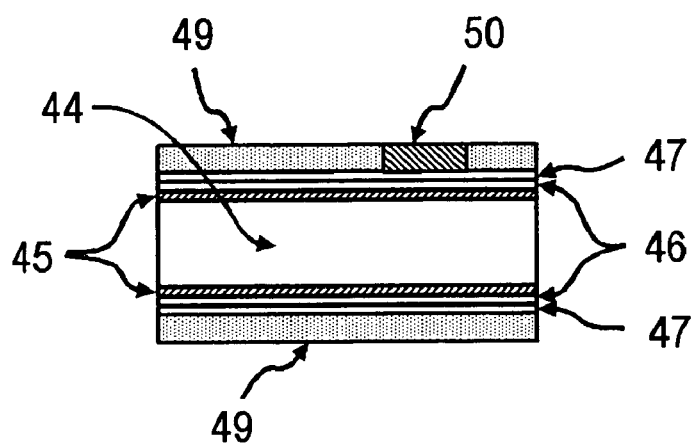
Figure 10C:
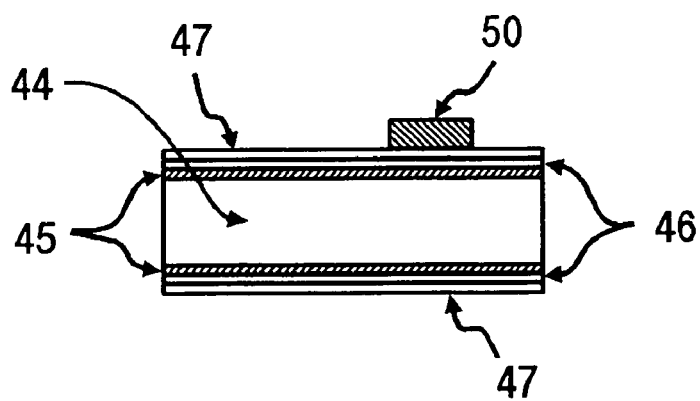

FIGS. 10A to 10C illustrate a method of manufacturing the lead frame according to the fourth embodiment.

To manufacture the PPF lead frame 41 according to the fourth embodiment, a PPF lead frame including the Ni plated layer 45, the Pd plated layer 46, and the Au plated layer 47 provided on the base metal 44 is to be prepared. FIG. 10A depicts a process of masking, with a masking film 49, the surface of the Au plated layer 47 of the PPF lead frame 41, except a part of a position 43 not to be included in the semiconductor device. For the masking film 49, a resist film may be employed.

FIG. 10B depicts a process of performing a Cu plating process over the PPF lead frame 41 covered with the masking film 49, with a Cu plating solution.

FIG. 10C depicts the PPF lead frame 41 with the Cu plated layer 50 in a finished state, obtained by removing the masking film 49 on the surface of the PPF lead frame 41 after the Cu plating process.

Fifth Embodiment

A fifth embodiment will now be described.

A method of manufacturing a semiconductor device according to the fifth embodiment includes an assembly process including mounting a semiconductor chip on the lead frame according to any of the first to the fourth embodiments, performing a wire bonding process thereby connecting the semiconductor chip and the lead frame, and encapsulating with a resin the wire-bonded semiconductor chip and the lead frame. The method also includes performing an appearance check after the assembly process, to inspect whether the thermal history monitor portion has discolored under heat load applied through the assembly process, thereby deciding whether an abnormality has emerged through the thermal history.

The method thus arranged allows deciding by appearance inspection whether abnormal heat load has been imposed.

Such inspection allows excluding a lead frame decided to have been subjected to an abnormal condition through the thermal history, thereby preventing disposing as a scrap a defective finished or semi-finished product after executing a posterior process that adds a value, and thus reducing the manufacturing cost.

Although the embodiments of the present invention have been described referring to the drawings, those are merely exemplary and various other structures may be adopted. For example, the fourth embodiment also provides the following aspect.

A method of manufacturing a lead frame for forming a semiconductor device, comprising masking, with a masking film, a plated layer provided over a surface of a base metal of the lead frame, except a part of a portion not to be included in the semiconductor device; performing a plating process of the plated layer of the lead frame with a copper plating solution; and removing the masking film.

It is apparent that the present invention is not limited to the above embodiment, but may be modified and changed without departing from the scope and spirit of the invention.

What is claimed is:

1. A lead frame, comprising:
   a base metal constituting a main portion of said lead frame, said base metal comprising an exposed surface and an unexposed surface;
   a composite plated layer provided over the unexposed surface of said base metal; and
   a thermal history monitor portion, located on the exposed surface of said base metal, that discolors under a heat load, said thermal history monitor portion being positioned in a monitoring section of said lead frame and outside of a semiconductor device section of said lead frame.

2. The lead frame according to claim 1, wherein said thermal history monitor portion that discolors under the heat load comprises an epoxy resin comprising a pigment.

3. The lead frame according to claim 1, wherein said base metal comprises one of a copper and a copper alloy.

4. The lead frame according to claim 1, wherein said composite plated layer comprises at least one of a palladium layer and a palladium alloy layer.

5. The lead frame according to claim 1, wherein said composite plated layer comprises a nickel layer, a palladium layer, and a gold layer.

6. The lead frame according to claim 1, wherein said thermal history monitor portion that discolors under the heat load is located at a position on said lead frame not intended to work as a semiconductor device.

7. The lead frame according to claim 1, wherein said lead frame comprises a plurality of semiconductor device portions arranged apart from each other, and said thermal history monitor portion is formed for said plurality of semiconductor device portions.

8. The lead frame according to claim 1, wherein said thermal history monitor portion that discolors under the heat load comprises one of a copper and a copper alloy.

9. The lead frame according to claim 8, wherein said thermal history monitor portion that discolors under the heat load comprises a portion of said exposed surface of said base metal.

10. A method of manufacturing a semiconductor device, said method comprising:
    assembling said semiconductor device including mounting a semiconductor chip on a lead frame according to claim 1;
    performing a wire bonding process thereby connecting said semiconductor chip and said lead frame;
    encapsulating with a resin said semiconductor chip and said lead frame wire-bonded; and
    performing an appearance check after said assembling, to inspect whether said thermal history monitor portion has discolored under the heat load applied through said assembling, thereby deciding whether an abnormality has emerged through said thermal history.

11. The lead frame according to claim 1, wherein said thermal history monitor portion that discolors under the heat load comprises an epoxy resin comprising a pigment that is disposed on the exposed surface of said base metal.

12. A method of manufacturing a lead frame, said method comprising:
    masking with a masking film a part of a base metal constituting a main portion of said lead frame that is not to be included in a semiconductor device, said base metal comprising an exposed surface that includes the part of said base material;
    performing a plating process over the unexposed surface of said base metal of said lead frame with a plating solution thereby forming a composite plated layer;
    removing said masking film; and
    forming a monitoring section on the exposed surface of said base metal.

13. The method according to claim 12, further comprising applying an epoxy resin comprising a pigment to said part of said base metal of said lead frame which has been masked with said masking film.

14. The method according to claim 12, further comprising:
    removing said part of the base metal that is not to be included in the semiconductor device from the lead frame to prepare a semiconductor device section of the lead frame for the semiconductor device.

15. The method according to claim 12, wherein the lead frame comprises a semiconductor device section and the monitoring section placed outside the semiconductor device section.

16. The method according to claim 15, further comprising:
    removing said monitoring section from the lead frame to prepare the semiconductor device section of the lead frame for the semiconductor device.

17. The method according to claim 15, wherein said monitoring section comprises a thermal history monitor portion that discolors under the heat load, said thermal history monitor portion being placed on the exposed surface of said base metal.

18. A method of manufacturing a semiconductor device, said method comprising:

preparing a lead frame, said lead frame comprising:
- a base metal constituting a main portion of said lead frame;
- a composite plated layer provided over a surface of said base metal; and
- a thermal history monitor portion that discolors under a heat load;

mourning a semiconductor chip on said lead frame;

performing a wire bonding process thereby connecting said semiconductor chip and said lead frame;

encapsulating with a resin said semiconductor chip and said lead frame wire-bonded; and removing said thermal history monitor portion that discolors under a heat load from said lead frame.

19. The method according to claim 18, wherein said base metal comprises one of copper and a copper alloy.

20. The method according to claim 18, wherein said composite plated layer comprises at least one of a palladium layer and a palladium alloy layer.

21. The method according to claim 18, wherein said composite plated layer comprises a nickel layer, a palladium layer, and a gold layer.

22. The method according to claim 18, wherein said lead frame comprises a plurality of semiconductor device portions arranged apart from each other, and said thermal history monitor portion is formed for said plurality of semiconductor device portions.

23. The method according to claim 18, wherein said thermal history monitor portion that discolors under the heat load comprises one of copper and a copper alloy.

24. The method according to claim 23, wherein said thermal history monitor portion that discolors under the heat load comprises a portion of said surface of said base metal.

25. The method according to claim 18, wherein said lead frame comprises one surface including a product section and a non-product section, and said thermal history monitor portion is positioned in said non-product section of said one surface.

26. The method according to claim 25, wherein said thermal history monitor portion is not positioned in said product section of said one surface.

27. The method according to claim 18, wherein said thermal history monitor portion that discolors under the heat load comprises one of copper and a copper alloy,
- wherein said thermal history monitor portion that discolors under the heat load comprises a portion of said surface of said base metal,
- wherein said composite plated layer comprises at least one of a palladium layer and a palladium alloy layer,
- wherein said lead frame further comprises one surface including a product section and a non-product section, and said thermal history monitor portion is positioned in said non-product section of said one surface, and
- wherein said semiconductor chip is mounted on said product section of said one surface.

28. The method according to claim 27, wherein said semiconductor chip is mounted on said composite plated layer in said product section of said one surface.

* * * * *